United States Patent
Davis et al.

(10) Patent No.: US 7,149,948 B2
(45) Date of Patent: Dec. 12, 2006

(54) MANUFACTURING TEST FOR A FAULT TOLERANT MAGNETORESISTIVE SOLID-STATE STORAGE DEVICE

(75) Inventors: James A. Davis, Richmond, VA (US); Jonathan Jedwab, Bristol (GB); Stephen Morley, Bristol (GB); Kenneth Graham Paterson, Middlesex (GB); Frederick A. Perner, Palo Alto, CA (US); Kenneth K. Smith, Boise, ID (US); Stewart R. Wyatt, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 581 days.

(21) Appl. No.: 09/997,199

(22) Filed: Nov. 28, 2001

(65) Prior Publication Data

US 2003/0023925 A1    Jan. 30, 2003

Related U.S. Application Data

(63) Continuation-in-part of application No. 09/915,179, filed on Jul. 25, 2001.

(51) Int. Cl.
    *G11C 29/00* (2006.01)
(52) U.S. Cl. .................................. 714/763
(58) Field of Classification Search .............. 714/6–7, 714/10, 15, 52, 54, 57, 704, 710, 763–764, 714/769, 773, 782; 365/33, 50, 55, 66, 97, 365/100, 148, 158, 171, 173, 190, 200, 201; 711/156, 202, 205, 229
    See application file for complete search history.

(56) References Cited

U.S. PATENT DOCUMENTS

| 4,069,970 A | 1/1978 | Buzzard et al. ............. 235/312 |
| 4,209,846 A | 6/1980 | Seppa ......................... 364/900 |
| 4,216,541 A | 8/1980 | Clover et al. ................. 371/38 |
| 4,458,349 A | 7/1984 | Aichelmann, Jr. et al. .... 371/13 |
| 4,845,714 A | 7/1989 | Zook ............................ 371/50 |
| 4,933,940 A | 6/1990 | Walter et al. ................ 371/9.1 |

(Continued)

FOREIGN PATENT DOCUMENTS

EP    0 494 547 A2    7/1992

(Continued)

OTHER PUBLICATIONS

Abstract of Japanese Patent No. JP 60007698, published Jan. 16, 1985, esp@cenet.com.
Peterson, W.W. and E.J. Weldon, Jr., *Error-Correcting Codes*, Second Edition, MIT Press, Ch. 1-3, 8 and 9 (1994).
*Reed-Solomon Codes and Their Applications*, S.B. Wicker and V.K. Bhargava, ed., IEEE Press, New York, Ch. 1, 2, 4 and 12 (1994).

*Primary Examiner*—Guy J. Lamarre (57) ABSTRACT

A fault-tolerant magnetoresistive solid-state storage device (MRAM) in use performs error correction coding and decoding of stored information, to tolerate physical defects. At manufacture, the MRAN device is tested to confirm that each set of storage cells is suitable for storing ECC encoded data, using either a parametric evaluation (step 602), or a logical evaluation (step 603) or preferably a combination of both. Failed cells are identified and a count is formed, suitably in terms of ECC symbols 206 that would be affected by such failed cells (step 604). The count can be compared to a threshold (step 605) to determine suitability of the accessed storage cells and a decision made (step 606) on whether to continue with use of those cells, or whether to take remedial action.

16 Claims, 6 Drawing Sheets

U.S. PATENT DOCUMENTS

| | | | |
|---|---|---|---|
| 4,939,694 A | 7/1990 | Eaton et al. | 365/200 |
| 5,233,614 A | 8/1993 | Singh | 371/21.6 |
| 5,263,030 A | 11/1993 | Rotker et al. | 371/39.1 |
| 5,313,464 A | 5/1994 | Reiff | 371/2.1 |
| 5,321,703 A | 6/1994 | Weng | 371/36 |
| 5,428,630 A | 6/1995 | Weng et al. | 371/40.1 |
| 5,459,742 A | 10/1995 | Cassidy et al. | 371/40.1 |
| 5,488,691 A | 1/1996 | Fuoco et al. | 395/185.05 |
| 5,502,728 A * | 3/1996 | Smith, III | 714/5 |
| 5,504,760 A | 4/1996 | Harari et al. | 371/40.1 |
| 5,590,306 A | 12/1996 | Watanabe et al. | 395/442 |
| 5,621,690 A | 4/1997 | Jungroth et al. | 365/200 |
| 5,745,673 A | 4/1998 | Di Zenzo et al. | 395/182.05 |
| 5,793,795 A | 8/1998 | Li | 375/200 |
| 5,848,076 A | 12/1998 | Yoshimura | 37/40.11 |
| 5,852,574 A | 12/1998 | Naji | 365/158 |
| 5,852,874 A | 12/1998 | Walker | 30/2 |
| 5,864,569 A | 1/1999 | Roohparvar | 371/40.18 |
| 5,887,270 A * | 3/1999 | Brant et al. | 711/162 |
| 5,966,389 A | 10/1999 | Kiehl | 371/40.1 |
| 5,987,573 A | 11/1999 | Hiraka | 711/156 |
| 6,009,550 A | 12/1999 | Gosula et al. | 714/769 |
| 6,112,324 A | 8/2000 | Howe et al. | 714/763 |
| 6,166,944 A | 12/2000 | Ogino | 365/97 |
| 6,233,182 B1 | 5/2001 | Satou et al. | 365/200 |
| 6,275,965 B1 | 8/2001 | Cox et al. | 714/755 |
| 6,279,133 B1 * | 8/2001 | Vafai et al. | 714/763 |
| 6,407,953 B1 | 6/2002 | Cleeves | 365/201 |
| 6,408,401 B1 | 6/2002 | Bhavsar et al. | 714/7 |
| 6,430,702 B1 * | 8/2002 | Santeler et al. | 714/6 |
| 6,456,525 B1 | 9/2002 | Perner et al. | 365/171 |
| 6,483,740 B1 | 11/2002 | Spitzer et al. | 365/158 |
| 6,574,775 B1 | 6/2003 | Chouly et al. | 714/800 |
| 6,684,353 B1 | 1/2004 | Parker et al. | 714/718 |
| 2002/0029341 A1 | 3/2002 | Juels et al. | 713/184 |
| 2003/0156469 A1 | 8/2003 | Viehmann et al. | 365/200 |

FOREIGN PATENT DOCUMENTS

| | | |
|---|---|---|
| EP | 0 918 334 A2 | 5/1999 |
| EP | 1 132 924 A2 | 9/2001 |
| JP | 03-244218 | 10/1991 |
| JP | 10-261043 | 9/1998 |

* cited by examiner

MANUFACTURING TEST FOR A FAULT TOLERANT MAGNETORESISTIVE SOLID-STATE STORAGE DEVICE

CROSS REFERENCE TO RELATED APPLICATION

This application is related to the pending U.S. patent application Ser. No. 09/440,323 filed on Nov. 15, 1999 now U.S. Pat. No. 6,532,565.

This is a continuation-in-part application of co-pending U.S. patent application Ser. No. 09/915,179, filed on Jul. 25, 2001, which is hereby incorporated by reference.

The present invention relates in general to a magnetoresistive solid-state storage device and to a method for testing a magnetoresistive solid-state storage device. In particular, but not exclusively, the invention relates to a method for testing a magnetoresistive solid-state storage device that in use will employ error correction coding (ECC).

A typical solid-state storage device comprises one or more arrays of storage cells for storing data. Existing semiconductor technologies provide volatile solid-state storage devices suitable for relatively short term storage of data, such as dynamic random access memory (DRAM), or devices for relatively longer term storage of data such as static random access memory (SRAM) or non-volatile flash and EEPROM devices. However, many other technologies are known or are being developed.

Recently, a magnetoresistive storage device has been developed as a new type of non-volatile solid-state storage device (see, for example, EP-A-0918334 Hewlett-Packard). The magnetoresistive solid-state storage device is also known as a magnetic random access memory (MRAM) device. MRAM devices have relatively low power consumption and relatively fast access times, particularly for data write operations, which renders MRAM devices ideally suitable for both short term and long term storage applications.

A problem arises in that MRAM devices are subject to physical failure, which can result in an unacceptable loss of stored data. Currently available manufacturing techniques for MRAM devices are subject to limitations and as a result manufacturing yields of commercially acceptable MRAM devices are relatively low. Although better manufacturing techniques are being developed, these tend to increase manufacturing complexity and cost. Hence, it is desired to apply lower cost manufacturing techniques whilst increasing device yield. Further, it is desired to increase cell density formed on a substrate such as silicon, but as the density increases manufacturing tolerances become increasingly difficult to control, again leading to higher failure rates and lower device yields. Since the MRAM devices are at a relatively early stage in development, it is desired to allow large scale manufacturing of commercially acceptable devices, whilst tolerating the limitations of current manufacturing techniques.

An aim of the present invention is to provide a method for testing a magnetoresistive solid-state storage device. A preferred aim is to provide a test which may be employed at manufacture of a device, preferably prior to storage of active user data.

According to a first aspect of the present invention there is provided a method for testing a magnetoresistive solid-state storage device, the method comprising the steps of: accessing a set of magnetoresistive storage cells, the set being arranged in use to store at least one block of ECC encoded data; and determining whether the accessed set of storage cells is suitable for, in use, storing at least one block of ECC encoded data.

Preferably, the method comprises determining whether original information is expected to be unrecoverable, if a block of ECC encoded data were to be stored in the accessed set of storage cells. In particular, it is determined whether original information is expected to be unrecoverable because the probability that original information is unrecoverable is unacceptably high. In the preferred embodiments a probability greater than of the order of $10^{-10}$ to $10^{-20}$ may be considered as too high. If so, remedial action is taken such as discarding that set of storage cells such that the set is not available in use to store a block of ECC encoded data. On the other hand, where the probability is acceptable, then use of the set of storage cells may continue.

Preferably, the method comprises determining, from accessing the set of storage cells, one or more failed symbols in a block of ECC encoded data that would have been affected by a physical failure. Then, suitably, a determination is made whether there are more failed symbols in the block of ECC encoded data than could be reliably corrected by error correction decoding the block of ECC encoded data. Here, a situation is identified where, due to physical failures, ECC decoding the block of ECC encoded data would probably fail to correctly recover original information. In other words, there is a high probability (i.e. close to 1) that decoding the block of ECC encoded data would not correctly recover original information.

The preferred test method comprises two aspects, which can be applied either alone or preferably in combination. The first aspect is parametric-based evaluation of the storage cells of the MRAM device, whilst the second aspect is a logic-based evaluation of the storage cells. These two aspects are each particularly useful in determining different types of physical failures which have been found to affect MRAM devices.

In the first aspect concerning parametric-based evaluation, the step of accessing the set of storage cells preferably comprises the steps of obtaining parametric values from the accessed set of storage cells and comparing the obtained parametric values against one or more ranges. For almost all storage cells in the MRAM device, such comparison indicates that, in use, a logical bit value could be successfully derived from that storage cell. However, due to inevitable manufacturing imperfections and other causes, a small proportion of the storage cells in the MRAM device are expected to be affected by physical failures. Conveniently, it has been found that storage cells can be identified as being affected by at least some types of physical failure, by evaluating the obtained parametric values. Preferably, a failed cell is identified where an obtained parametric value falls into a predetermined failure range. In the preferred embodiment, the obtained parametric value represents resistance, and the predetermined failure range represents an abnormally low resistance or an abnormally high resistance, which indicates cells affected by physical failures known as shorted bits and open bits, respectively.

The second aspect employs a logic-based evaluation of the accessed set of storage cells. Here, the step of accessing the set of storage cells preferably comprises the steps of writing test data to the set of storage cells, reading the test data from the set of storage cells, and comparing the written test data against the read test data. It has been found that this write-read-compare operation advantageously allows storage cells to be identified as being affected by certain types of physical failure. In the preferred embodiment of the present invention, the logic-based evaluation is particularly useful in determining physical failures known as half-select bits and single failed bits.

The determining step of the preferred method preferably comprises determining a failure count, based on the identified failed cells. That is, a failure count is determined based on the failed cells identified by either the parametric-based evaluation or the logic-based evaluation, and preferably a combination of both. In one example, the failure count can simply represent the number of identified failed cells within the accessed set of storage cells. Preferably, the failure count is based on failed symbols of a block of ECC encoded data that, in use, would be affected by the identified failed cells. Here, the method suitably comprises determining the position of the identified failed cells within the array of storage cells of the MRAM device, and from this determining the one or more symbols of ECC encoded data which, in use, would be affected by failed storage cells in those positions.

The determining step preferably further comprises the step of comparing the failure count against a threshold value. As one option, the threshold value represents, for the accessed set of storage cells, the maximum number of failed cells which can be tolerated in use by a block of ECC encoded data stored in those storage cells. Here, the threshold value conveniently represents the situation where there is an unacceptably high probability that original information would not be correctly recovered. Preferably, the threshold value represents the total number of failed symbols which can be reliably corrected by ECC decoding a block of ECC encoded data to be stored in the accessed set of storage cells. As a second option, the threshold value represents a safety margin less than the total number of failed symbols correctable in use by ECC decoding, such as between about 50% to 95% of the total number. In this situation the threshold value is particularly useful in that not all physical failures in MRAM devices can be readily identified by testing, and the threshold value is set such that, given the identified number of failures, it would still be reasonable to perform ECC decoding in use, whilst allowing for an additional number of as yet unidentified failures to affect the block of ECC encoded data to be stored in the accessed set of storage cells. Additionally or alternatively, the threshold value is useful in that new systematic failures may arise as the device ages, and in use the device may be susceptible to random failures.

Conveniently, in use original information is received for storing in the MRAM device in units of a sector, such as 512 bytes. The original information sector is error correction encoded to form one or more blocks of ECC encoded data. In the preferred embodiment, a linear ECC scheme such as a Reed-Solomon code is employed. Conveniently, each sector of original information is encoded to form a sector of ECC encoded data comprising four codewords. Each codeword suitably forms the block of ECC encoded data mentioned above.

According to a second aspect of the present invention there is provided a method for controlling a magnetoresistive solid-state storage device, comprising the steps of: accessing a set of magnetoresistive storage cells, the set being arranged in use to store at least one block of ECC encoded data; comparing parametric values obtained by accessing the set of storage cells against one or more ranges; identifying failed cells amongst the accessed set of storage cells; forming a failure count based on the identified failed cells; comparing the failure count against a threshold value; and determining whether the accessed set of storage cells is suitable for, in use, storing at least one block of ECC encoded data.

According to a third aspect of the present invention there is provided a method for controlling a magneto-resistive solid-state storage device, comprising the steps of: accessing a set of magneto-resistive storage cells, the set being arranged in use to store at least one block of ECC encoded data; writing test data to the accessed set of storage cells; reading test data from the accessed set of storage cells; comparing the written test data against the read test data, to identify failed cells amongst the accessed set of storage cells; forming a failure count based on the identified failed cells; comparing the failure count against a threshold value; and determining whether the accessed set of storage cells is suitable for, in use, storing at least one block of ECC encoded data.

According to a fourth aspect of the present invention there is provided a method for controlling a magnetoresistive solid-state storage device, comprising the steps of: accessing a set of magnetoresistive storage cells, the set being arranged in use to store at least one block of ECC encoded data; comparing parametric values obtained by accessing the set of storage cells against one or more ranges and thereby identifying failed cells amongst the accessed set of storage cells; performing write-read-compare on test data in the accessed set of storage cells, to thereby identify failed cells amongst the accessed set of storage cells; forming a failure count based on the identified failed cells; comparing the failure count against a threshold value; and determining whether the accessed set of storage cells is suitable for, in use, storing at least one block of ECC encoded data.

According to a fifth aspect of the present invention there is provided a magnetoresistive solid-state storage device, comprising: at least one array of magnetoresistive storage cells; an ECC encoding unit for, in use, forming a block of ECC encoded data from a unit of original information; a controller arranged to store the block of ECC encoded data in a set of the storage cells; and a test unit arranged to access the set of storage cells, and determine whether the accessed set of storage cells is suitable for, in use, storing the block of ECC encoded data.

For a better understanding of the invention, and to show how embodiments of the same may be carried into effect, reference will now be made, by way of example, to the accompanying diagrammatic drawings in which.

To assist a complete understanding of the present invention, an example MRAM device will first be described with reference to FIG. 1, including a description of the failure mechanisms found in MRAM devices. The preferred methods for testing such MRAM devices will then be described with reference to FIGS. 2 to 6.

Figure 1:
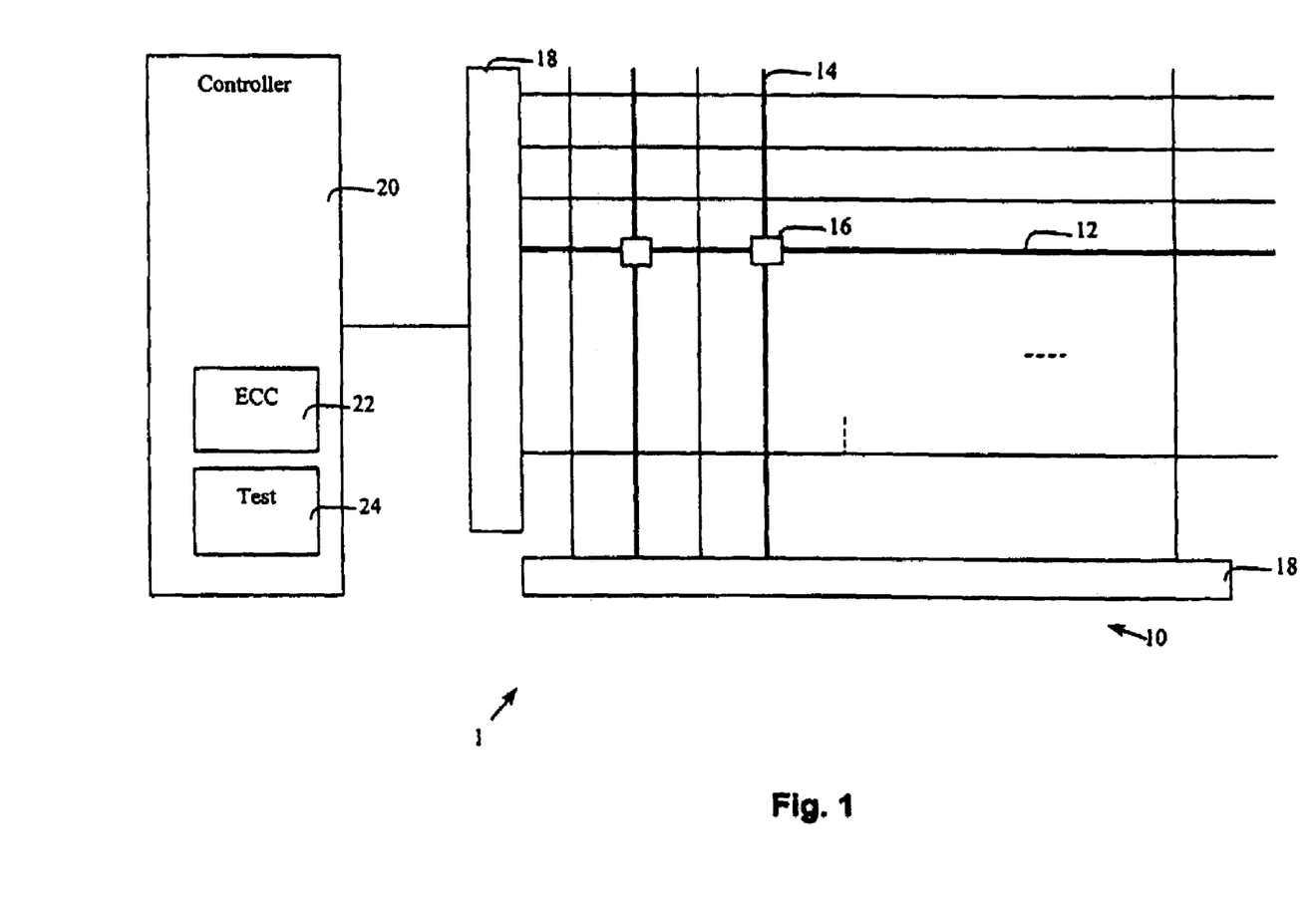
FIG. 1 is a schematic diagram showing a preferred MRAM device including an array of storage cells.

FIG. 1 shows a simplified magnetoresistive solid-state storage device 1 comprising an array 10 of storage cells 16. The array 10 is coupled to a controller 20 which, amongst other control elements, includes an ECC coding and decoding unit 22 and a test unit 24. The controller 20 and the array 10 can be formed on a single substrate, or can be arranged separately. If desired, the test unit 24 is arranged physically separate from the MRAM device 1 and they are coupled together when it is desired to test the MRAM device.

In one preferred embodiment, the array 10 comprises of the order of 1024 by 1024 storage cells, just a few of which are illustrated. The cells 16 are each formed at an intersection between control lines 12 and 14. In this example control lines 12 are arranged in rows, and control lines 14 are arranged in columns. One row 12 and one or more columns 14 are selected to access the required storage cell or cells 16 (or conversely one column and several rows, depending upon the orientation of the array). Suitably, the row and column lines are coupled to control circuits 18, which include a plurality of read/write control circuits. Depending upon the implementation, one read/write control circuit is provided per column, or read/write control circuits are multiplexed or shared between columns. In this example the control lines 12 and 14 are generally orthogonal, but other more complicated lattice structures are also possible.

In a read operation of the currently preferred MRAM device, a single row line 12 and several column lines 14 (represented by thicker lines in FIG. 1) are activated in the array 10 by the control circuits 18, and a set of data read from those activated cells. This operation is termed a slice. The row in this example is 1024 storage cells long l and the accessed storage cells 16 are separated by a minimum reading distance m, such as sixty-four cells, to minimise cross-cell interference in the read process. Hence, each slice provides up to l/m=1024/64=16 bits from the accessed array.

To provide an MRAM device of a desired storage capacity, preferably a plurality of independently addressable arrays 10 are arranged to form a macro-array. Conveniently, a small plurality of arrays (typically four) are layered to form a stack, and plural stacks are arranged together, such as in a 16×16 layout. Preferably, each macro-array has a 16×18×4 or 16×20×4 layout (expressed as width×height×stack layers). Optionally, the MRAM device comprises more than one macro-array. In the currently preferred MRAM device only one of the four arrays in each stack can be accessed at any one time. Hence, a slice from a macro-array reads a set of cells from one row of a subset of the plurality of arrays 10, the subset preferably being one array within each stack.

Each storage cell 16 stores one bit of data suitably representing a numerical value and preferably a binary value, i.e. one or zero. Suitably, each storage cell includes two films which assume one of two stable magnetisation orientations, known as parallel and anti-parallel. The magnetisation orientation affects the resistance of the storage cell. When the storage cell 16 is in the anti-parallel state, the resistance is at its highest, and when the magnetic storage cell is in the parallel state, the resistance is at its lowest. Suitably, the anti-parallel state defines a zero logic state, and the parallel state defines a one logic state, or vice versa. As further background information, EP-A-0 918 334 (Hewlett-Packard) discloses one example of a magnetoresistive solid-state storage device which is suitable for use in preferred embodiments of the present invention.

Although generally reliable, it has been found that failures can occur which affect the ability of the device to store data reliably in the storage cells 16. Physical failures within an MRAM device can result from many causes including manufacturing imperfections, internal effects such as noise in a read process, environmental effects such as temperature and surrounding electromagnetic noise, or ageing of the device in use. In general, failures can be classified as either systematic failures or random failures. Systematic failures consistently affect a particular storage cell or a particular group of storage cells. Random failures occur transiently and are not consistently repeatable. Typically, systematic failures arise as a result of manufacturing imperfections and ageing, whilst random failures occur in response to internal effects and to external environmental affects.

Failures are highly undesirable and mean that at least some storage cells in the device cannot be written to or read from reliably. A cell affected by a failure can become unreadable, in which case no logical value can be read from the cell, or can become unreliable, in which case the logical value read from the cell is not necessarily the same as the value written to the cell (e.g. a "1" is written but a "0" is read). The storage capacity and reliability of the device can be severely affected and in the worst case the entire device becomes unusable.

Failure mechanisms take many forms, and the following examples are amongst those identified:

1. Shorted bits—where the resistance of the storage cell is much lower than expected. Shorted bits tend to affect all storage cells lying in the same row and the same column.
2. Open bits—where the resistance of the storage cell is much higher than expected. Open bit failures can, but do not always, affect all storage cells lying in the same row or column, or both.
3. Half-select bits—where writing to a storage cell in a particular row or column causes another storage cell in the same row or column to change state. A cell which is vulnerable to half select will therefore possibly change state in response to a write access to any storage cell in the same row or column, resulting in unreliable stored data.
4. Single failed bits—where a particular storage cell fails (e.g. is stuck always as a "0"), but does not affect other storage cells and is not affected by activity in other storage cells.

These four example failure mechanisms are each systematic, in that the same storage cell or cells are consistently affected. Where the failure mechanism affects only one cell, this can be termed an isolated failure. Where the failure mechanism affects a group of cells, this can be termed a grouped failure.

Whilst the storage cells of the MRAM device can be used to store data according to any suitable logical layout, data is preferably organised into basic data units (e.g. bytes) which in turn are grouped into larger logical data units (e.g. sectors). A physical failure, and in particular a grouped failure affecting many cells, can affect many bytes and possibly many sectors. It has been found that keeping information about logical units such as bytes affected by physical failures is not efficient, due to the quantity of data involved. That is, attempts to produce a list of all such logical units rendered unusable due to at least one physical failure, tend to generate a quantity of management data which is too large to handle efficiently. Further, depending on how the data is organised on the device, a single physical failure can potentially affect a large number of logical data units, such that avoiding use of all bytes, sectors or other units affected by a failure substantially reduces the storage capacity of the device. For example, a grouped failure such as a shorted bit failure in just one storage cell affects many other storage cells, which lie in the same row or the same column. Thus, a single shorted bit failure can affect 1023 other cells lying in the same row, and 1023 cells lying in the same column—a total of 2027 affected cells. These 2027 affected cells may form part of many bytes, and many sectors, each of which would be rendered unusable by the single grouped failure.

Some improvements have been made in manufacturing processes and device construction to reduce the number of manufacturing failures and improve device longevity, but this usually involves increased manufacturing costs and complexity, and reduced device yields. Hence, techniques are being developed which respond to failures and avoid future loss of data. One example technique is the use of sparing. A row identified as containing failures is made redundant (spared) and replaced by one of a set of unused additional spare rows, and similarly for columns. However, either a physical replacement is required (i.e. routing connections from the failed row or column to instead reach the spare row or column), or else additional control overhead is required to map logical addresses to physical row and column lines. Only a limited sparing capacity can be provided, since enlarging the device to include spare rows and columns reduces device density for a fixed area of substrate and increases manufacturing complexity. Therefore, where failures are relatively common, sparing is unable to cope leading to possible loss of data. Also, sparing is not useful in handling random failures, and involves additional management overhead to determine deployment of sparing capacity.

The MRAM devices of the preferred embodiments of the present invention in use employ error correction coding to provide a device which is error tolerant, preferably to tolerate and recover from both random failures and systematic failures. Typically, error correction coding involves receiving original information which it is desired to store and forming encoded data which allows errors to be identified and ideally corrected. The encoded data is stored in the solid-state storage device. At read time, the original information is recovered by error correction decoding the encoded stored data. A wide range of error correction coding (ECC) schemes are available and can be employed alone or in combination. Suitable ECC schemes include both schemes with single-bit symbols (e.g. BCH) and schemes with multiple-bit symbols (e.g. Reed-Solomon).

As general background information concerning error correction coding, reference is made to the following publication: W. W. Peterson and E. J. Weldon, Jr., "Error-Correcting Codes", $2^{nd}$ edition, $12^{th}$ printing, 1994, MIT Press, Cambridge Mass.

A more specific reference concerning Reed-Solomon codes used in the preferred embodiments of the present invention is: "Reed-Solomon Codes and their Applications", ED. S. B. Wicker and V. K. Bhargava, IEEE Press, New York, 1994.

Figure 2:
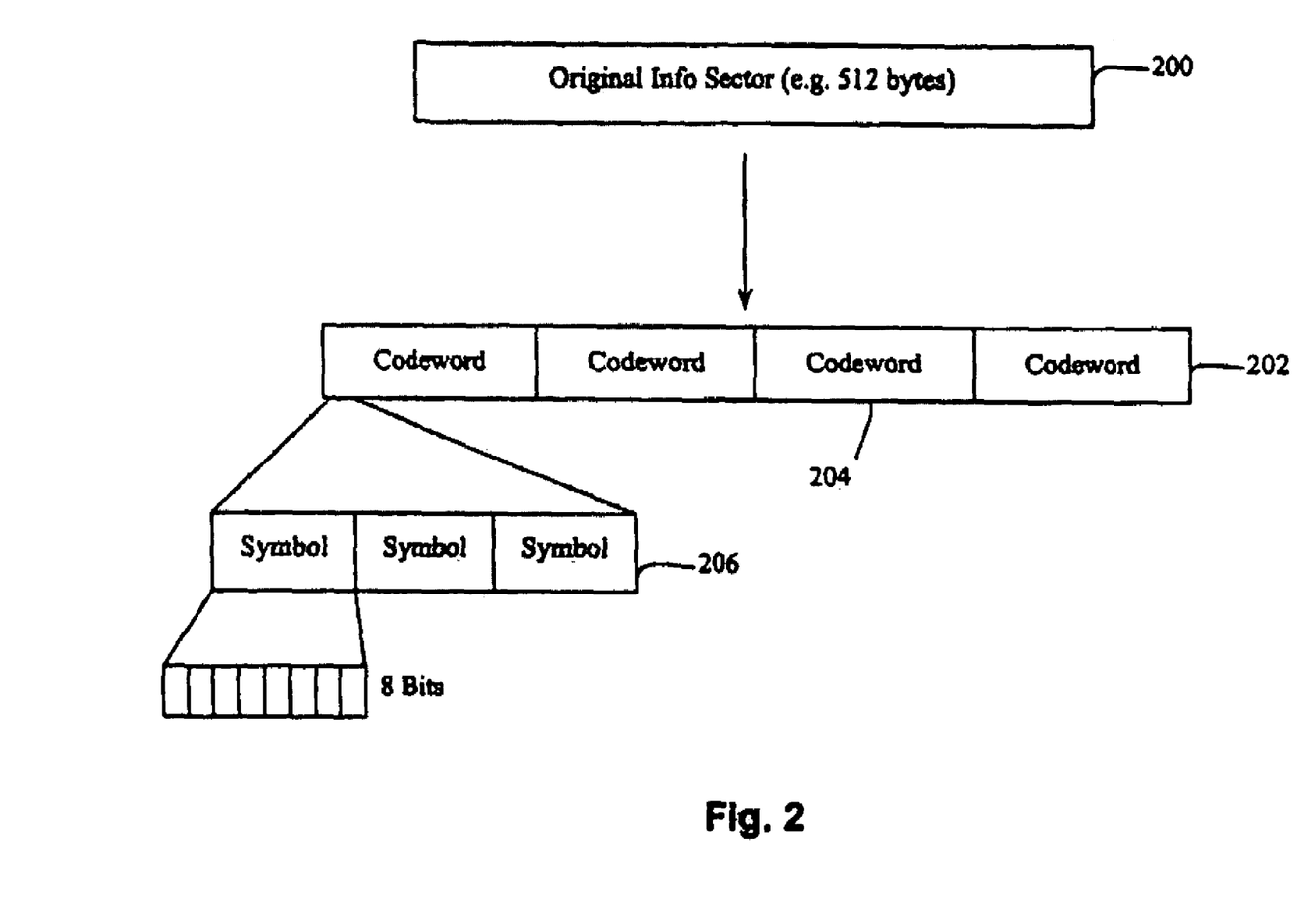
FIG. 2 shows a preferred logical data structure.

FIG. 2 shows an example logical data structure used when storing active data in the MRAM device 10. Original information 200 is received in predetermined units such as a sector comprising 512 bytes. Error correction coding is performed to produce a block of encoded data 202, in this case an encoded sector. The encoded sector 202 comprises a plurality of symbols 206 which can be a single bit (e.g. a BCH code with single-bit symbols) or can comprise multiple bits (e.g. a Reed-Solomon code using multi-bit symbols). In the preferred Reed-Solomon encoding scheme, each symbol 206 conveniently comprises eight bits. As shown in FIG. 2, the encoded sector 202 comprises four codewords 204, each comprising of the order of 144 to 160 symbols. The eight bits corresponding to each symbol are conveniently stored in eight storage cells 16. A physical failure which affects any of these eight storage cells can result in one or more of the bits being unreliable (i.e. the wrong value is read) or unreadable (i.e. no value can be obtained), giving a failed symbol.

Error correction decoding the encoded data 202 allows failed symbols 206 to be identified and corrected. The preferred Reed-Solomon scheme is an example of a linear error correcting code, which mathematically identifies and corrects completely up to a predetermined maximum number of failed symbols 206, depending upon the power of the code. For example, a [160,128,33] Reed-Solomon code producing codewords having one hundred and sixty 8-bit symbols corresponding to one hundred and twenty-eight original information bytes and a minimum distance of thirty-three symbols can locate and correct up to sixteen symbol errors. Suitably, the ECC scheme employed is selected with a power sufficient to recover original information 200 from the encoded data 202 in substantially all cases. Very rarely, a block of encoded data 202 is encountered which is affected by so many failures that the original information 200 is unrecoverable. Also, even more very rarely the failures result in a mis-correct, where information recovered from the encoded data 202 is not equivalent to the original information 200. Even though the recovered information does not correspond to the original information, a mis-correct is not readily determined.

In the current MRAM devices, grouped failures tend to affect a large group of storage cells, lying in the same row or column. This provides an environment which is unlike prior storage devices. The preferred embodiments of the present invention employ an ECC scheme with multi-bit symbols. Where manufacturing processes and device design change over time, it may become more appropriate to organise storage locations expecting bit-based errors and then apply an ECC scheme using single-bit symbols, and at least some of the following embodiments can be applied to single-bit symbols.

Figure 3:
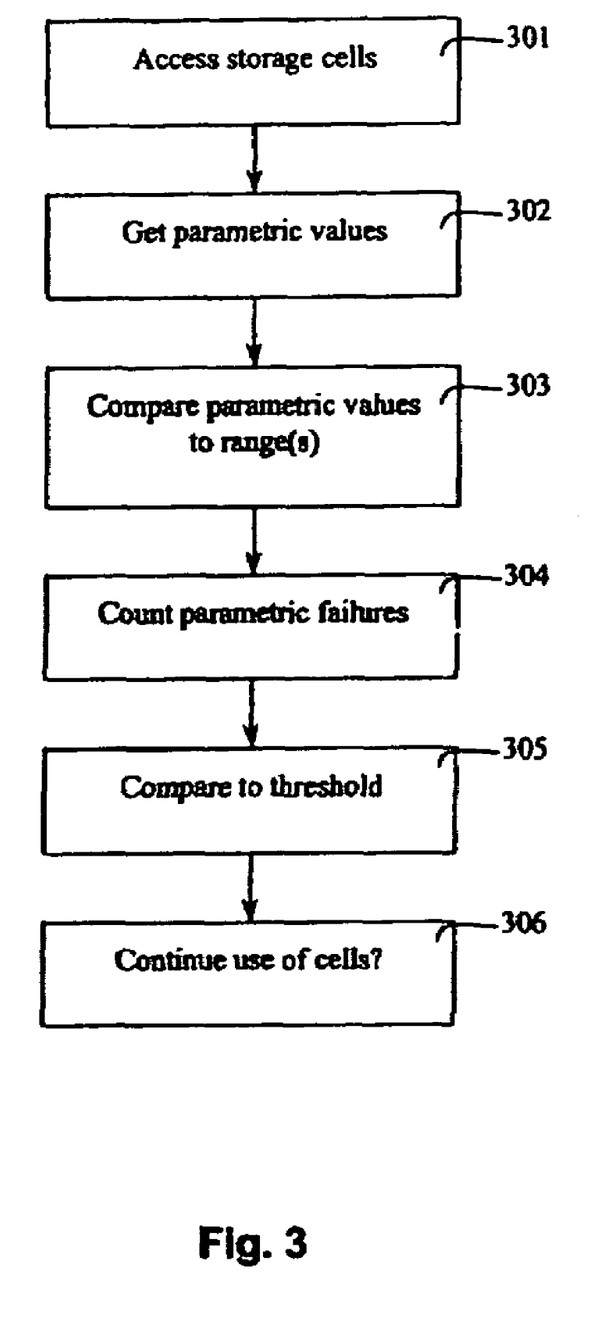
FIG. 3 shows a preferred method for testing an MRAM device, using parametric evaluation.

FIG. 3 shows a preferred method for testing the MRAM device 1, using parametric evaluation.

In step 301 a set of storage cells are accessed, preferably in a set of read operations. The accessed set of storage cells correspond to a set of cells which, in use, would be used to store a block of ECC encoded data such as an encoded sector 202 or a codeword 204. The accessed set of storage cells represents a sufficient number of storage cells for the following steps to be performed, and any suitable set of storage cells can be accessed. In the currently preferred embodiments, it is convenient for the accessed set of storage cells to represent a single codeword, or an integer number of codewords. In the preferred ECC coding scheme each codeword 204 is decoded in isolation, and the results from ECC decoding plural codewords (in this case four codewords) provides ECC decoded data corresponding to an original information sector 200.

Step 302 comprises obtaining a plurality of parametric values associated with the accessed set of storage cells. Suitably, a read voltage is applied along the row and column control lines 12, 14 causing a sense current to flow through selected storage cells 16, which have a resistance determined by parallel or anti-parallel alignment of the two magnetic films. The resistance of a particular cell is determined according to a phenomenon known as spin tunnelling and the cells are often referred to as magnetic tunnel junction storage cells. The condition of the storage cell is determined by measuring the sense current (proportional to resistance) or a related parameter such as response time to discharge a known capacitance.

Step 303 comprises comparing the obtained parametric values to one or more predicted ranges. The comparison of step 303, in almost all cases, allows a logical value (e.g. one or zero) to be established for each cell. However, the comparison also conveniently allows storage cells affected by at least some forms of physical failure to be identified. For example, it has been determined that a shorted bit failure leads to a very low resistance value in all cells of a particular row and a particular column. Also, open-bit failures can cause a very high resistance value for all cells of a particular row and column. By comparing the obtained parametric values against predicted ranges, cells affected by failures such as shorted-bit and open-bit failures can be identified with a high degree of certainty.

Figure 4:
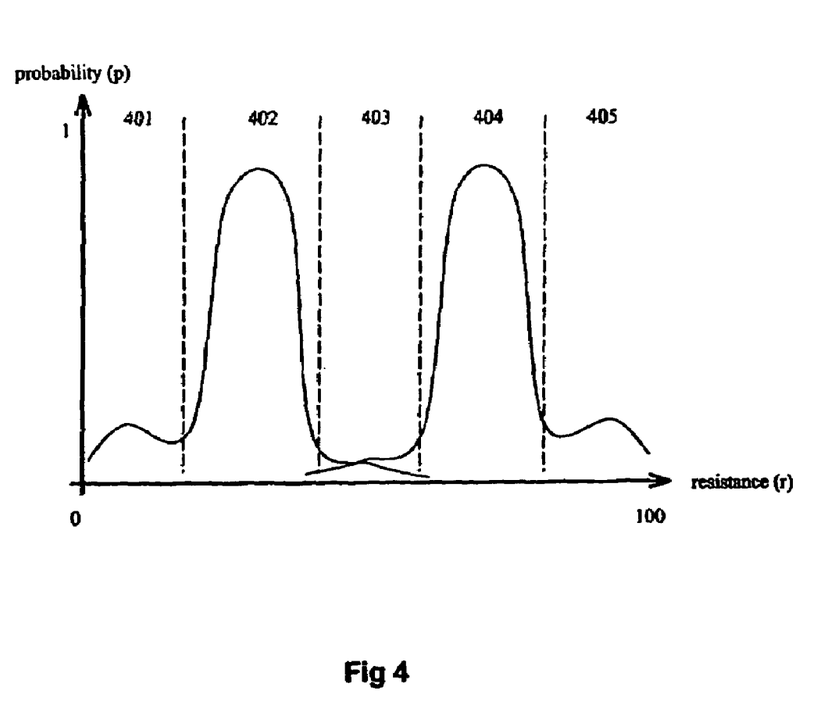
FIG. 4 is a graph illustrating a parametric value obtained from a storage cell of an MRAM device.

FIG. 4 is a graph as an illustrative example of the probability (p) that a particular cell will have a certain parametric value, in this case resistance (r), corresponding to a logical "0" in the left-hand curve, or a logical "1" in the right-hand curve. As an arbitrary scale, probability has been given between 0 and 1, whilst resistance is plotted between 0 and 100%. The resistance scale has been divided into five ranges. In range 401, the resistance value is very low and the predicted range represents a shorted-bit failure with a reasonable degree of certainty. Range 402 represents a low resistance value within expected boundaries, which in this example is determined as equivalent to a logical "0". Range 403 represents a medium resistance value where a logical value cannot be ascertained with any degree of certainty. Range 404 is a high resistance range representing a logical "1". Range 405 is a very high resistance value where an open-bit failure can be predicted with a high degree of certainty. The ranges shown in FIG. 4 are purely for illustration, and many other possibilities are available depending upon the physical construction of the MRAM device 1, the manner in which the storage cells are accessed, and the parametric values obtained. The range or ranges are suitably calibrated depending, for example, on environmental factors such as temperature, factors affecting a particular cell or cells and their position within the array, or the nature of the cells themselves and the type of access employed.

Referring again to FIG. 3, step 304 comprises counting a number of physical failures, preferably on the basis of failed cells identified in the comparison of step 303. Suitably, the count of parametric failures in step 304 is performed on the basis of the number of symbols 206 (each containing one or more bits) which would, in use, be affected by the identified failed cells.

Step 305 comprises comparing the number of parametric failures, i.e. the number of failed symbols identified by parametric testing, against a predetermined threshold value. The number of physical failures can be represented in any suitable form. Depending upon the nature of the ECC scheme employed, some types of failure can be weighted differently to other types of failure. Since, in use, the data to be stored in the storage cells represents encoded data, it is expected that ECC decoding will not be able reliably to correctly recover the original data, where the number of parametric failures is greater than the maximum power of the ECC scheme. Hence, the threshold value is suitably selected to represent a value which is equal to or less than the maximum number of failures which the ECC scheme employed is able to correct. Preferably, the threshold value in step 305 is selected to be substantially less than the maximum power of the ECC decoding scheme, suitably of the order of 50% to 95% of the maximum power. In a particular preferred embodiment the threshold value in step 305 is selected to represent about 50% to 75% and suitably about 60% of the maximum power of the employed ECC scheme. Preferably, the step 305 comprises determining the number of parametric failures to be greater than the threshold value, such that, in use, performing ECC decoding is expected (with a sufficiently high probability) not to be able to correctly recover information from the encoded data. That is, where the number of parametric failures is greater than the threshold value, there is a greater than acceptable probability that information is unrecoverable from the encoded data, or that a miscorrect will occur.

Step 306 comprises determining whether or not to continue use of the set of cells corresponding to the accessed block of data, in view of the number of parametric failures which have been identified. If desired, remedial action can be taken. Such remedial action may take any suitable form, to manage future activity in the storage cells 16. As one example, the set of storage cells 16 corresponding to a codeword 204 or to a complete encoded sector 202 are identified and discarded, in order to avoid possible loss of data in future. In the currently preferred embodiments it is most convenient to use or discard sets of storage cells corresponding to an encoded sector 202, although greater or lesser granularity can be applied as desired. In the preferred embodiment, each sector comprises four codewords, and a sector is made redundant where any one of its four codewords contains a number of failures which is greater than the threshold value of step 305.

The test method of FIG. 3 is particularly useful as a test procedure immediately following manufacture of the device, or at installation, or at power up, or at any convenient time subsequently. In one example, the test procedure of FIG. 3 is performed by writing a test set of data to the device and then reading from the device, or by any other suitable parametric testing. In particular, it is useful to apply the method of FIG. 3 to identify areas of the MRAM device which are severely affected by systematic errors caused by manufacturing imperfections, and remedial action can then be taken before the device is put into active use storing variable user data.

The parametric evaluation of FIG. 3 is particularly useful in determining shorted-bit and/or open-bit failures in MRAM devices. A systematic failure, such as a half select or some forms of isolated bit failure, is not so easily detectable using parametric tests. Even so, by selecting an appropriate threshold value, the test method is able to provide a practical device which is able to take advantage of the considerable benefits offered by the new MRAM technology whilst minimising the limitations of current available manufacturing techniques.

Figure 5:
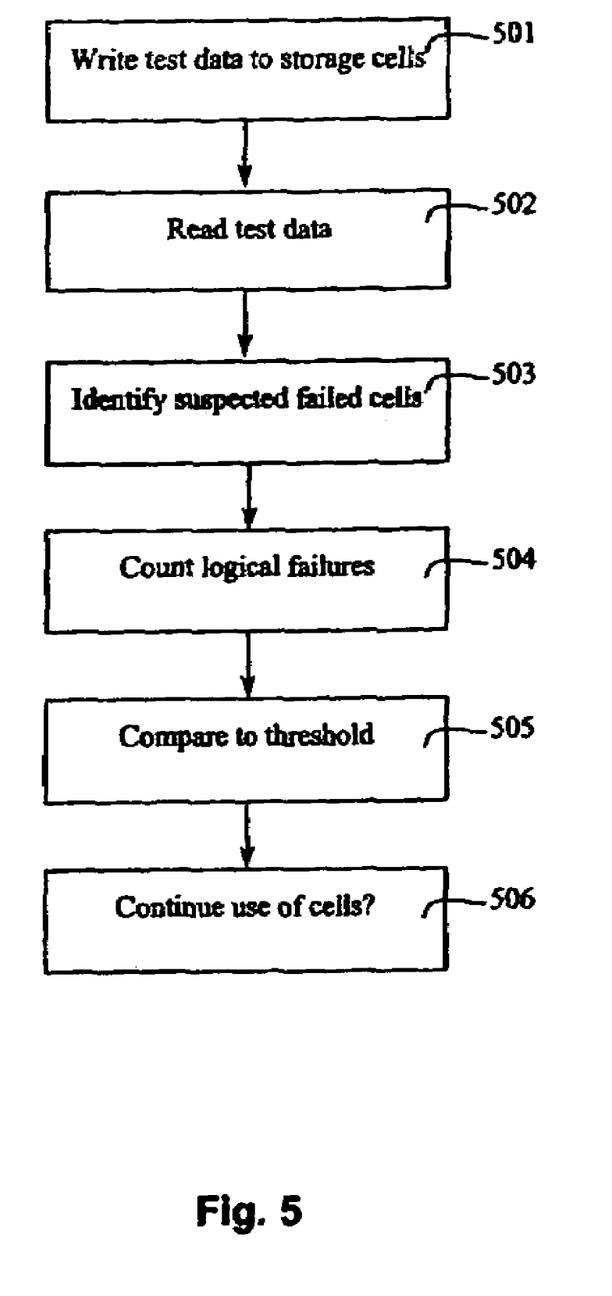
FIG. 5 shows a preferred method for testing an MRAM device, using logic-based evaluation.

A second preferred test method will now be described with reference to FIG. 5, using logic-based evaluation.

In step 501, test data is written to a selected set of storage cells 16. This set suitably represents the same set as used for parametric evaluation in the method of FIG. 3. The test data may take any suitable form, according to any suitable logical structure. For example, the test data may, or may not, include ECC encoded data.

In step 502, the test data is read from the set of storage cells.

In step 503, the written test data and the read test data are compared to identify suspected failed cells. If desired, steps 501 and 502 can be repeated one or more times, to increase confidence that failed cells have been correctly identified. Many different types of failures can be identified. By selecting appropriate test data, failed cells affected by shorted-bit and/or open-bit failures can be identified, but the method is particularly useful in identifying cells affected by half-select failures or single-bit failures.

Step 504 comprises forming a count of logically-identified failures. Similar to step 304, this count is suitably performed on the basis of the number of symbols 206 (each containing one or more bits) which would, in use, be affected by the identified failed cells.

Step 505 comprises comparing the failure count against a predetermined threshold value. This comparison is preferably similar to the comparison performed in the parametric evaluation. The threshold value is suitably selected to represent a value which is equal to or less than the maximum number of failures which the ECC scheme to be employed in use is able to correct. In one embodiment, the threshold value is selected to be of the order of 50% to 95% of this maximum power.

Step 506 comprises determining whether or not to continue use of the set of cells, in view of the failure count based on logically identified failed cells. Remedial action can be taken if desired, as discussed for step 306.

Figure 6:
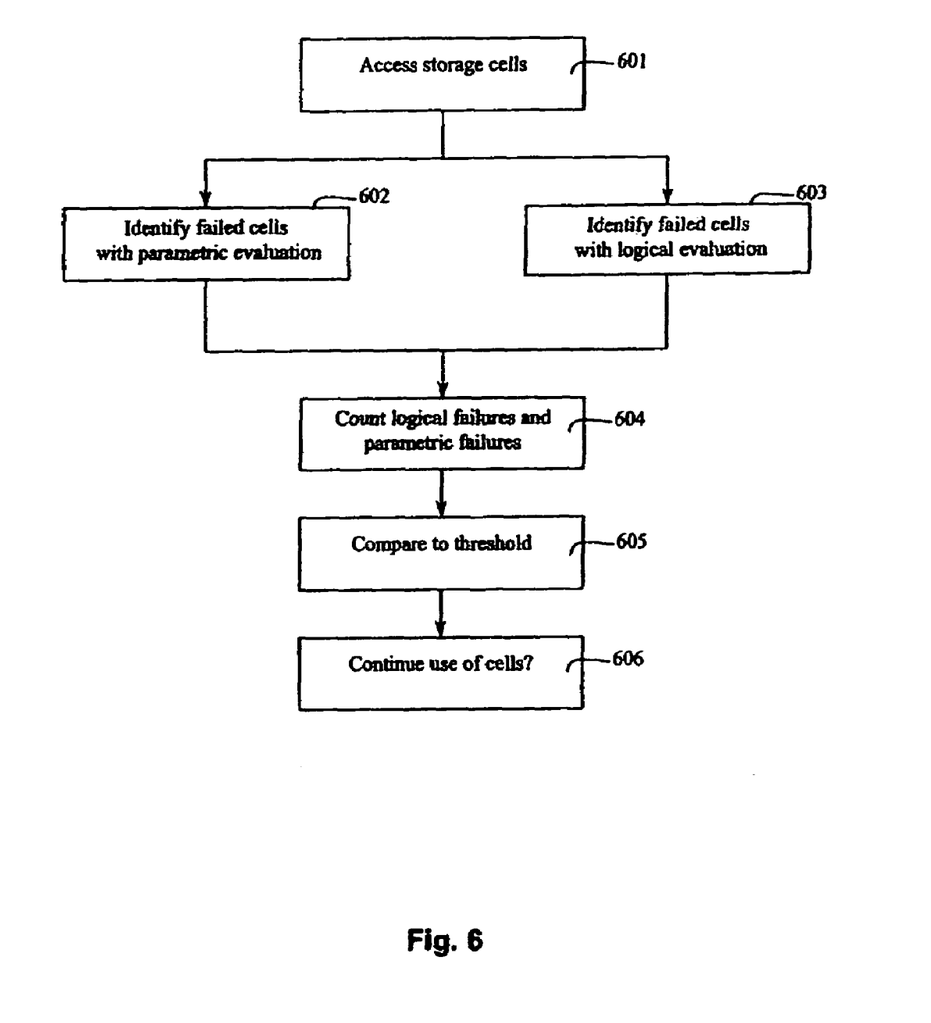
FIG. 6 shows a preferred method for testing an MRAM device using a combination of both parametric evaluation and logic-based evaluation.

FIG. 6 shows a preferred test method combining both parametric evaluation and logical evaluation.

Step 601 comprises accessing a set of storage cells. In step 602, failed cells are identified with parametric evaluation as discussed above in the method of FIG. 3. In step 603, failed cells, ideally with different types of physical failures, are identified with logical evaluation as discussed in FIG. 5. The logical failures and parametric failures are counted in step 604, and this failure count compared against a threshold in step 605. At step 606, a decision is made whether to continue with active use of the accessed storage cells. Ideally, logical evaluation and parametric evaluation are combined in order identify failed cells from a greater range of physical failures than is possible with either method alone.

The MRAM device described herein is ideally suited for use in place of any prior solid-state storage device. In particular, the MRAM device is ideally suited both for use as a short-term storage device (e.g. cache memory) or a longer-term storage device (e.g. a solid-state hard disk). An MRAM device can be employed for both short term storage and longer term storage within a single apparatus, such as a computing platform.

A magnetoresistive solid-state storage device and a method for testing such a device have been described. Advantageously, the storage device is able to tolerate a relatively large number of errors, including both systematic failures and transient failures, whilst successfully remaining in operation with no loss of original data. Simpler and lower cost manufacturing techniques are employed and/or device yield and device density are increased. As manufacturing processes improve, overhead of the employed ECC scheme can be reduced. However, error correction coding and decoding allows blocks of data, e.g. sectors or codewords, to remain in use, where otherwise the whole block must be discarded if only one failure occurs. Therefore, the preferred embodiments of the present invention avoid large scale discarding of logical blocks and reduce or even eliminate completely the need for inefficient control methods such as large-scale data mapping management or physical sparing.

The invention claimed is:

1. A method for testing a magnetoresistive solid-state storage device, the method comprising:
    accessing a set of magnetoresistive storage cells, the set being arranged in use to store at least one block of ECC encoded data;
    determining whether the accessed set of storage cells is suitable for, in use, storing at least one block of ECC encoded data; and
    determining, from accessing the set of storage cells, one or more failed cells, determining the position of the identified failed cells, and from this determining one or more symbols of ECC encoded data which, in use, would be affected by failed cells in those positions.

2. The method of claim 1, comprising determining whether there would be more failed symbols in a block of ECC encoded data than could be reliably corrected by, in use, error correction decoding the block of ECC encoded data.

3. A method for testing a magnetoresistive solid-state storage device, the method comprising:
    accessing a set of magnetoresistive storage cells, the set being arranged in use to store at least one block of ECC encoded data;
    determining whether the accessed set of storage cells is suitable for, in use, storing at least one block of ECC encoded data;
    obtaining a parametric value for each of the set of storage cells;
    comparing each parametric value against a range or ranges; and
    identifying failed cell or cells, amongst the set of storage cells, as being affected by a physical failure, where the parametric value falls into one or more failure ranges.

4. The method of claim 3, comprising identifying storage cells for which a logical bit value is derivable.

5. The method of claim 3, comprising forming a failure count based on the identified failed cells, and comparing the failure count against a threshold value.

6. The method of claim 5, comprising using the identified failed cells to determine failed symbols, and wherein the failure count is based on the failed symbols.

7. The method of claim 6, wherein the threshold value represents a number of failed symbols equal to or less than a total number of failed symbols which, in use, could be reliably corrected by error correction decoding a block of ECC encoded data to be stored in the accessed set of storage cells.

8. The method of claim 7, wherein the threshold value is set to be in the range of about 50% to about 95% of the maximum number of failed symbols which could be reliably corrected by error correction decoding the block of ECC encoded data.

9. A method for testing a magnetoresistive solid-state storage device, the method comprising:
    accessing a set of magnetoresistive storage cells, the set being arranged in use to store at least one block of ECC encoded data;
    determining whether the accessed set of storage cells is suitable for, in use, storing at least one block of ECC encoded data;
    writing test data to the set of storage cells;
    reading the test data from the set of storage cells; and
    comparing the written test data to the read test data to identify a failed cell or cells amongst the set of storage cells as being affected by a physical failure.

10. The method of claim 9, comprising forming a failure count based on the identified failed cells, and comparing the failure count against a threshold value.

11. The method of claim 9, comprising using the identified failed cells to determine failed symbols, and wherein the failure count is based on the failed symbols.

12. The method of claim 11, wherein the threshold value represents a number of failed symbols equal to or less than a total number of failed symbols which, in use, could be reliably corrected by error correction decoding a block of ECC encoded data to be stored in the accessed set of storage cells.

13. The method of claim 12, wherein the threshold value is set to be in the range of about 50% to about 95% of the maximum number of failed symbols which could be corrected by error correction decoding the block of ECC encoded data.

14. A method for controlling a magnetoresistive solid-state storage device, comprising the steps of:
- accessing a set of magnetoresistive storage cells, the set being arranged in use to store at least one block of ECC encoded data;
- comparing parametric values obtained by accessing the set of storage cells against one or more ranges;
- identifying failed cells amongst the accessed set of storage cells;
- forming a failure count based on the identified failed cells;
- comparing the failure count against a threshold value; and
- determining whether the accessed set of storage cells is suitable for, in use, storing at least one block of ECC encoded data.

15. A method for controlling a magneto-resistive solid-state storage device, comprising the steps of:
- accessing a set of magnetoresistive storage cells, the set being arranged in use to store at least one block of ECC encoded data;
- writing test data to the accessed set of storage cells;
- reading test data from the accessed set of storage cells;
- comparing the written test data against the read test data, to identify failed cells amongst the accessed set of storage cells;
- forming a failure count based on the identified failed cells;
- comparing the failure count against a threshold value; and
- determining whether the accessed set of storage cells is suitable for, in use, storing at least one block of ECC encoded data.

16. A method for controlling a magnetoresistive solid-state storage device, comprising the steps of:
- accessing a set of magnetoresistive storage cells, the set being arranged in use to store at least one block of ECC encoded data;
- comparing parametric values obtained by accessing the set of storage cells against one or more ranges and thereby identifying failed cells amongst the accessed set of storage cells;
- performing write-read-compare on test data in the accessed set of storage cells, to thereby identify failed cells amongst the accessed set of storage cells;
- forming a failure count based on the identified failed cells;
- comparing the failure count against a threshold value; and
- determining whether the accessed set of storage cells is suitable for, in use, storing at least one block of ECC encoded data.

* * * * *